(12) United States Patent
Naito et al.

(10) Patent No.: US 8,866,194 B2
(45) Date of Patent: Oct. 21, 2014

(54) SEMICONDUCTOR DEVICE

(75) Inventors: Shinya Naito, Gifu (JP); Hideaki Fujiwara, Hashima (JP); Toru Dan, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 87 days.

(21) Appl. No.: 11/902,560

(22) Filed: Sep. 24, 2007

(65) Prior Publication Data

US 2008/0078998 A1     Apr. 3, 2008

(30) Foreign Application Priority Data

Sep. 28, 2006  (JP) ................................. 2006-263848
Nov. 22, 2006  (JP) ................................. 2006-315082
Aug. 3, 2007   (JP) ................................. 2007-202592

(51) Int. Cl.
| | |
|---|---|
| H01L 29/66 | (2006.01) |
| H01L 27/06 | (2006.01) |
| H01L 21/8249 | (2006.01) |
| H01L 29/08 | (2006.01) |
| H01L 29/737 | (2006.01) |
| H01L 29/78 | (2006.01) |

(52) U.S. Cl.
CPC ............. *H01L 21/8249* (2013.01); *H01L 29/78* (2013.01); *H01L 27/0623* (2013.01); *H01L 29/0821* (2013.01); *H01L 29/7378* (2013.01); *H01L 29/66242* (2013.01); *H01L 29/0804* (2013.01)
USPC ............. 257/197; 257/47; 257/194; 257/205; 257/272; 257/273; 257/370; 257/539; 257/E27.014; 257/E31.009; 257/E21.068

(58) Field of Classification Search
USPC .................... 257/187, 226, 51, 310
See application file for complete search history.

(56) References Cited

U.S. PATENT DOCUMENTS

| | | | | |
|---|---|---|---|---|
| 4,958,201 | A | * | 9/1990 | Mimura .......................... 257/25 |
| 5,633,181 | A | * | 5/1997 | Hayashi ........................ 438/234 |
| 6,534,802 | B1 | * | 3/2003 | Schuegraf ..................... 257/194 |

(Continued)

FOREIGN PATENT DOCUMENTS

| | | |
|---|---|---|
| JP | 57-133672 A | 8/1982 |
| JP | 02-049431 A | 2/1990 |

(Continued)

OTHER PUBLICATIONS

Kanchana Vydianathan, Guillermo Nuesca, Gregory Peterson, Eric T. Eisenbraun, and Alain E. Kaloyerosa, "Metalorganic chemical vapor deposition of titanium oxide for microelectronics applications", Jun. 2001, Material Research Society, vol. 16, No. 6, pp. 1838-1849.*

(Continued)

*Primary Examiner* — David Vu
*Assistant Examiner* — Cuong B Nguyen
(74) *Attorney, Agent, or Firm* — Kevin B. Jackson

(57) ABSTRACT

A semiconductor device (npn bipolar transistor) includes an n-type collector layer, a base layer constituted by a $p^+$ diffusion layer, a SiGe layer and a p-type silicon film, an n-type emitter layer and a charge transport prevention film formed between the n-type collector layer and the n-type emitter layer and having an effect as a potential barrier with respect to either electrons or holes.

20 Claims, 16 Drawing Sheets

(56) References Cited

U.S. PATENT DOCUMENTS

| | | | |
|---|---|---|---|
| 7,052,941 | B2 | 5/2006 | Lee |
| 7,304,333 | B2 | 12/2007 | Niwa |
| 7,378,702 | B2 | 5/2008 | Lee |
| 7,470,142 | B2 | 12/2008 | Lee |
| 7,470,598 | B2 | 12/2008 | Lee |
| 7,632,738 | B2 | 12/2009 | Lee |
| 7,633,162 | B2 | 12/2009 | Lee |
| 7,671,371 | B2 | 3/2010 | Lee |
| 7,718,508 | B2 | 5/2010 | Lee |
| 7,799,675 | B2 | 9/2010 | Lee |
| 7,800,199 | B2 | 9/2010 | Oh et al. |
| 7,846,814 | B2 | 12/2010 | Lee |
| 7,863,748 | B2 | 1/2011 | Oh et al. |
| 7,867,822 | B2 | 1/2011 | Lee |
| 7,888,764 | B2 | 2/2011 | Lee |
| 8,018,058 | B2 | 9/2011 | Lee |
| 8,058,142 | B2 | 11/2011 | Lee |
| 8,071,438 | B2 | 12/2011 | Lee |
| 2004/0155299 | A1* | 8/2004 | Bhattacharyya .............. 257/378 |
| 2005/0280155 | A1 | 12/2005 | Lee |
| 2005/0280156 | A1 | 12/2005 | Lee |
| 2006/0011944 | A1 | 1/2006 | Fujiwara et al. |
| 2006/0180833 | A1 | 8/2006 | Inoue et al. |
| 2006/0267145 | A1* | 11/2006 | Nowak et al. ................. 257/565 |
| 2006/0275962 | A1 | 12/2006 | Lee |
| 2007/0019339 | A1* | 1/2007 | Gill ........................... 360/324.2 |
| 2008/0032463 | A1 | 2/2008 | Lee |
| 2008/0048327 | A1 | 2/2008 | Lee |
| 2010/0038743 | A1 | 2/2010 | Lee |
| 2010/0133695 | A1 | 6/2010 | Lee |
| 2010/0190334 | A1 | 7/2010 | Lee |
| 2011/0001172 | A1 | 1/2011 | Lee |
| 2011/0003438 | A1 | 1/2011 | Lee |
| 2011/0143506 | A1 | 6/2011 | Lee |
| 2011/0291234 | A1 | 12/2011 | Lee |

FOREIGN PATENT DOCUMENTS

| | | | |
|---|---|---|---|
| JP | 02-210820 | A | 8/1990 |
| JP | 07-326629 | A | 12/1995 |
| JP | 08-213408 | A | 8/1996 |
| JP | 08-288300 | A | 11/1996 |
| JP | 2003-017601 | | 1/2003 |
| JP | 2003-109965 | A | 4/2003 |
| JP | 2004-200255 | A | 7/2004 |
| JP | 2005-150531 | A | 6/2005 |
| JP | 2006-54409 | | 2/2006 |
| WO | WO-2005/010934 | A2 | 2/2005 |

OTHER PUBLICATIONS

Donkers, J.J.T.M., et al., "Metal Emitter SiGe:C HBTs", 2004, IEEE.

Paul Van Halen, David L. Pulfrey, "High-Gain Bipolar Transistors With Polysilicon Tunnel Junction Emitter Contacts", IEEE Transactions on Electron Devices, vol. ED-32, No. 7, Jul. 1985, pp. 1307-1313.

Crystal Structures and Lattice Constants of Semiconductor and Other Materials; http://www.siliconfareast.com/lattice_constants.htm, 2004.

Binay Prasai, Bin Cai, M. Kylee Underwood, James P. Lewis, D.A. Drabold, "Properties of Amorphous and Crystalline Titanium Dioxide From First Principles", J Mater Sci, DOI 10.1007/s10853-012-6439-6, published online Apr. 3, 2012.

Wikipedia, "Quantum Tunneling" http://en.wikipedia.org/wiki/Quantum_tunnelling, pp. 1-12, Apr. 13, 2014.

Olaf van't Erve, Device Properties of Spin-Valve Transistor and Magnetic Tunnel Transistor, Ph.D. Thesis, University of Twente, Twente University Press, http://www.tup.utwente.nl/catalogue/book/index.jsp?isbn=9036517354, 2002.

Japanese Office Action issued in Japanese Patent Application No. 2007-202592 dated Nov. 13, 2012.

* cited by examiner

SEMICONDUCTOR DEVICE

CROSS-REFERENCE TO RELATED APPLICATIONS

The priority application numbers JP2006-263848, Semiconductor Device, Sep. 28, 2006, Shinya Naito, Hideaki Fujiwara, Toru Dan, JP2006-315082, Semiconductor Device, Nov. 22, 2006, Shinya Naito, Hideaki Fujiwara, Toru Dan, JP2007-202592, Semiconductor Device, Aug. 3, 2007, Shinya Naito, Hideaki Fujiwara, Toru Dan, upon which this patent application is based are hereby incorporated by reference.

BACKGROUND OF THE INVENTION

1. Field of the Invention

The present invention relates to a semiconductor device.

2. Description of the Background Art

A current-driven bipolar transistor is known as an exemplary conventional semiconductor device. In a conventional bipolar transistor, a diffusion current is generated due to difference between the impurity concentrations of an emitter layer and a base layer, and an electron current (emitter current) flows from the emitter layer to the base layer, while a hole current (base current) flows from the base layer to the emitter layer. The gain of the current of the bipolar transistor is generally represented by a value obtained by dividing a collector current by the base current. The collector current and the emitter current are substantially identical with each other, and hence it may be considered that the gain of the current of the bipolar transistor is a value obtained by dividing the emitter current by the base current. In the conventional bipolar transistor, difference is provided between the impurity concentrations of the emitter layer and the base layer, and the current of the bipolar transistor is amplified due to generation of the difference between the emitter current and the base current. In recent years, the resistance of the base layer is required to be reduced in order to improve high speed response (high frequency characteristic) of the bipolar transistor, and therefore a larger quantity of the impurity is implanted into the base layer. However, implantation of a large quantity of the impurity increases the base current, and hence the gain of the current of the bipolar transistor is disadvantageously reduced.

In relation to this, there has generally been proposed a structure capable of reducing the gain of the current of the bipolar transistor while increasing the impurity concentration of the base layer of the bipolar transistor and reducing the resistance of the base layer. In this conventional semiconductor device, a base layer consisting of SiGe is employed. The band gap of Ge is smaller than that of silicon, and hence the band gap of SiGe is an intermediate value between silicon and Ge. Therefore, the band gap of the base layer is smaller than that of an emitter layer or a collector layer consisting of Si. Thus, energy difference on a side closer to a valence band of the boundary between the emitter layer and the base layer is increased, and hence movement of holes (hole current) from the base layer to the emitter layer is reduced to some extent as compared with a case of employing a base layer consisting of silicon. Consequently, the movement of holes is reduced to some extent even when the impurity concentration of the base layer is increased in order to reduce the resistance of the base layer, and hence the gain of the current of the bipolar transistor can be reduced.

In the aforementioned conventional semiconductor device, however, it is disadvantageously difficult to sufficiently suppress the movement of holes between the emitter layer and the base layer.

SUMMARY OF THE INVENTION

A semiconductor device according to an aspect of the present invention comprises a first conductive type collector layer, a second conductive type base layer, a first conductive type emitter layer, and a charge transport prevention portion formed at least one of on a boundary between said collector layer and said base layer, in said base layer, on a boundary between said base layer and said emitter layer and in said emitter layer, and having an effect as a potential barrier with respect to either electrons or holes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
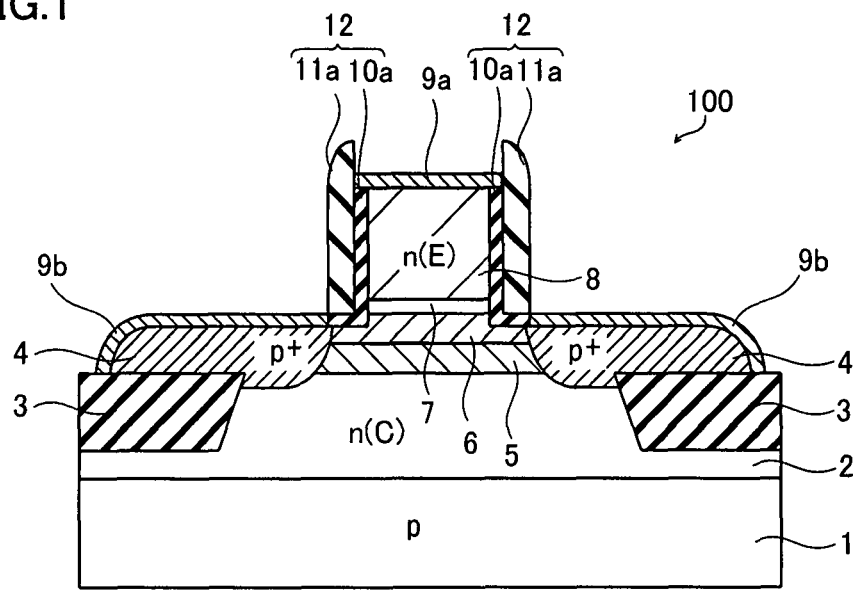
FIG. 1 is a cross sectional view showing a structure of a bipolar transistor according to a first embodiment of the present invention.

Embodiments of the present invention will be hereinafter described with reference to the drawings.

(First Embodiment)

A structure of an npn bipolar transistor 100 comprising a charge transport prevention film according to a first embodiment of the present invention will be now described with reference to FIG. 1.

In the npn bipolar transistor 100, an n-type collector layer 2 is formed on a surface of a p-type silicon substrate 1. An isolation region 3 employing STI (shallow trench isolation) is so formed as to surround an element forming region on a surface of the n-type collector layer 2. A pair of p$^+$ diffusion layers 4 are formed on the surface of the n-type collector layer 2 at a prescribed interval. A SiGe layer 5 consisting of silicon germanium (SiGe) having a thickness of about 40 nm is formed in a region held between the pair of p$^+$ diffusion layers 4 on the upper surface of the n-type collector layer 2. A p-type silicon film 6 having a thickness of about 40 nm is formed on an upper surface of the SiGe layer 5. The p$^+$ diffusion layers 4, the SiGe layer 5 and the p-type silicon film 6 constitute a base layer.

A charge transport prevention film 7 constituted by a TiO$_2$ film, having a thickness of about 3 nm to about 10 nm is formed on an upper surface of the p-type silicon film 6. The charge transport prevention film 7 has a function of sufficiently suppressing movement of holes while hardly suppressing movement of electrons. The charge transport prevention film 7 is required to be formed by a material having a higher dielectric constant as compared with that of silicon (about 11.9), and is desired to be formed preferably employing a material having a dielectric constant of not less than about 30. As shown in "Material Science Approach to High-k Gate Dielectric Insulators for Si-ULSI", IEICE Trans. C, Vol. J84-C, No. 2, pp. 76-89, Akira Toriumi, February 2001, in the material having a dielectric constant of not less than about 30, the height of a potential barrier with respect to electrons is not more than 1 eV. When the height of the potential barrier with respect to electrons is not more than 1 eV, an effect of suppressing an electron current is generally reduced. The dielectric constant of the TiO$_2$ film constituted by the charge transport prevention film 7 is about 50, which is a higher dielectric constant as compared with that of silicon (about 11.9). An n-type emitter layer 8 having a thickness of about 200 nm is formed on an upper surface of the charge transport prevention film 7. Cobalt silicide films 9a and 9b are formed on upper surfaces of the n-type emitter layer 8 and the pair of p$^+$ diffusion layers 4 respectively. A silicon nitride film 10a is formed on a prescribed region of the p-type silicon film 6, side surfaces of the charge transport prevention film 7, the n-type emitter layer 8 and the cobalt silicide film 9a. A side wall insulating film 11a is formed on side surfaces of the silicon nitride film 10a. A side wall insulating film 12 is formed by these silicon nitride film 10a and side wall insulating film 11a.

Figure 2:
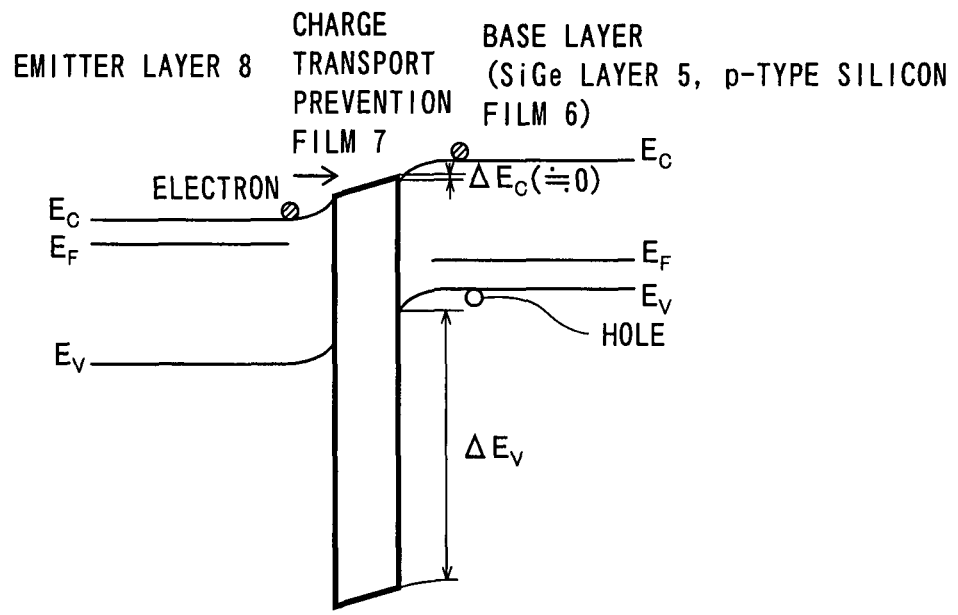
FIG. 2 is a diagram showing an energy band between an emitter layer and a base layer of the bipolar transistor according to the first embodiment.

The energy band of the npn bipolar transistor 100 according to the first embodiment of the present invention will be now described with reference to FIG. 2.

The charge transport prevention film 7 has an energy band in which a barrier height ($\Delta E_C$) with respect to electrons is substantially 0 and a barrier height ($\Delta E_V$) with respect to holes is large. Thus, electrons move by diffusion from the n-type emitter layer 8 to the base layer constituted by the SiGe layer 5 and the p-type silicon film 6 over the charge transport prevention film 7, while holes is sufficiently inhibited from moving from the base layer constituted by the SiGe layer 5 and the p-type silicon film 6 to the n-type emitter layer 8 due to the barrier of the charge transport prevention film 7. In FIG. 2, reference character $E_C$ denotes energy of the bottom of a conduction band and reference character $E_V$ denotes energy of the top of the valence band. Reference character $E_F$ denotes Fermi energy.

A process of fabricating the bipolar transistor 100 according to the first embodiment of the present invention will be described with reference to FIGS. 3 to 12.

Figure 3:
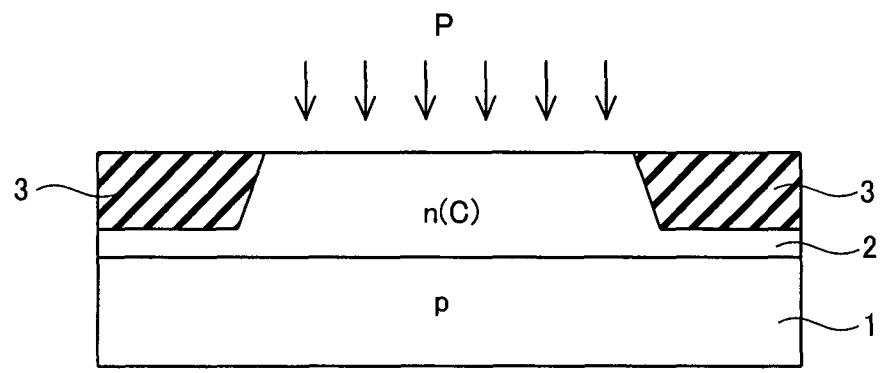
FIGS. 3 to 12 are cross sectional views for illustrating a process of fabricating the bipolar transistor according to the first embodiment shown in FIG. 1.

As shown in FIG. 3, the n-type collector layer 2 is formed by ion-implanting phosphorus (P) into a prescribed region of the p-type silicon substrate 1. The isolation region 3 employing STI is formed on the p-type silicon substrate 1.

Figure 4:
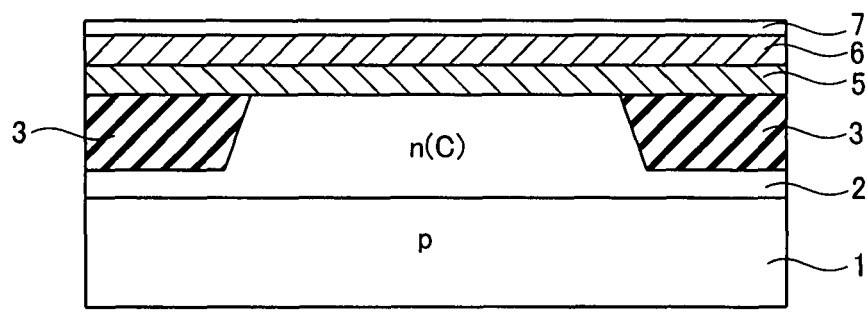

As shown in FIG. 4, the SiGe layer 5 having a thickness of about 40 nm and the p-type silicon film 6 having a thickness of about 40 nm are successively formed on the upper surfaces of the n-type collector layer 2 and the isolation region 3 by low pressure CVD (chemical vapor deposition). The SiGe layer 5 and the p-type silicon film 6 are doped with boron (B) at a concentration of about $1.0 \times 10^{19}$ cm$^{-3}$. The concentration of Ge in the SiGe layer 5 may be constant in the SiGe layer 5 or may be gradually increase from a side in contact with the p-type silicon film 6 of the SiGe layer 5 toward a side in contact with the n-type collector layer 2 of the SiGe layer 5. At this time, the concentration of Ge is preferably substantially 0% on the side in contact with the p-type silicon film 6, while the concentration of Ge is preferably substantially about 15% to about 20% on the side in contact with the n-type collector layer 2. The concentration of Ge gradually increases from the side in contact with the p-type silicon film 6 of the SiGe layer 5 toward the side in contact with the n-type collector layer 2 of the SiGe layer 5, whereby slope of a potential capable of accelerating electrons is formed, and hence the transit time of electrons moving in the SiGe layer 5 can be reduced. Consequently, the bipolar transistor 100 can be operated at a high speed.

The charge transport prevention film 7 constituted by the TiO$_2$ film, having a thickness of about 3 nm to about 10 nm is formed on the upper surface of the p-type silicon film 6 by low pressure CVD. At this time, the charge transport prevention film 7 may be so formed by an amorphous material as to have a flat upper surface or may be formed by polycrystalline film constituted by crystal grains each having a crystal grain size of about 5 nm to about 20 nm. The charge transport prevention film 7 may be formed employing organic metal such as TDMAT (tetrakis dimethylamino titanium) or TDEAT (tetrakis diethylamino titanium) as a source material. In this case, carbon (C) contained as an impurity diffuses in the SiGe layer 5 when performing thermal treatment described later.

Figure 5:
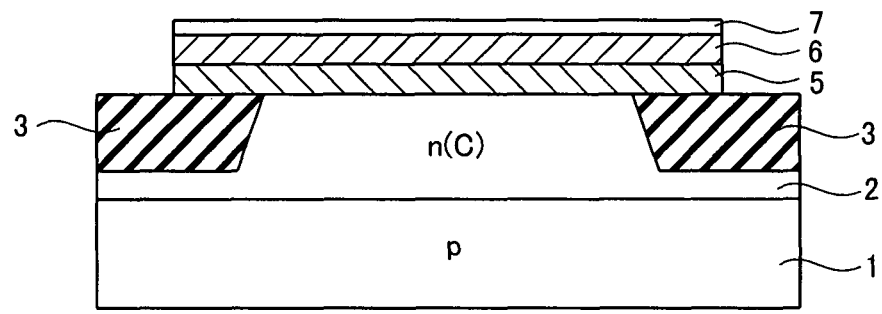

As shown in FIG. 5, prescribed regions of the SiGe layer 5 and the p-type silicon film 6 and the charge transport prevention film 7 are removed.

Figure 6:
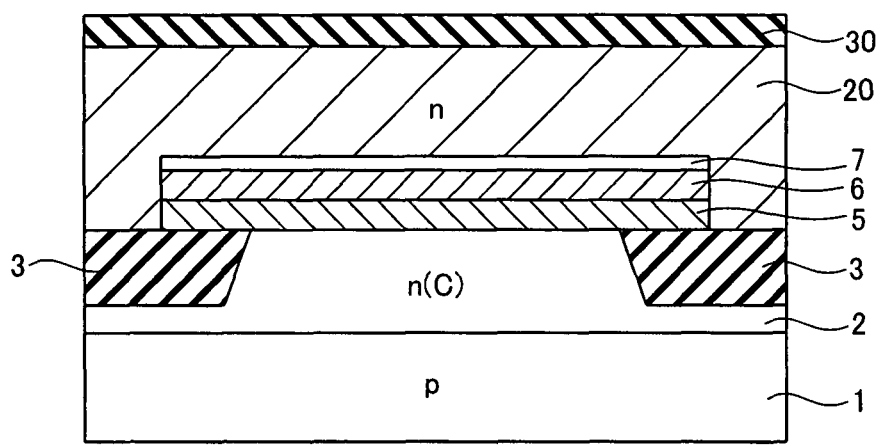

As shown in FIG. 6, a polycrystalline silicon film 20 and a silicon nitride film 30 are successively formed on the upper surfaces of the isolation region 3 and the charge transport prevention film 7. The polycrystalline silicon film 20 is an n-type polycrystalline silicon film.

Figure 7:
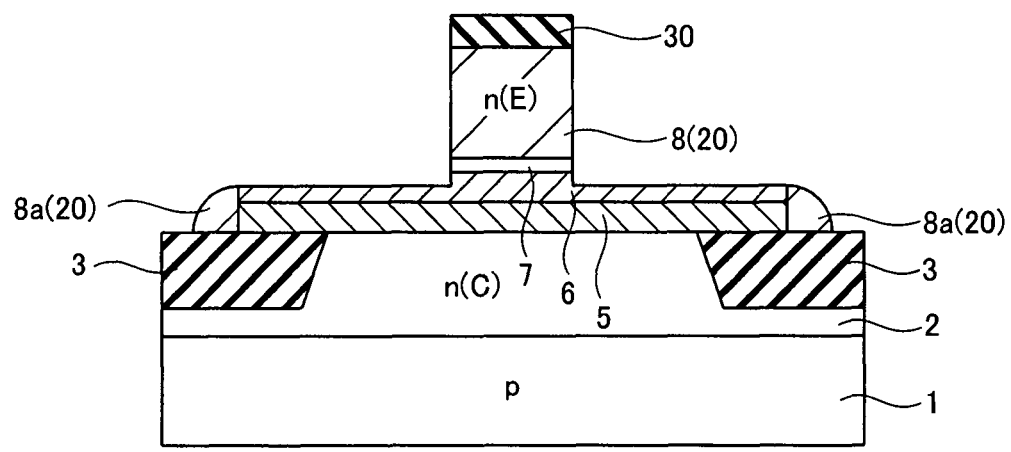

As shown in FIG. 7, the silicon nitride film 30, the polycrystalline silicon film 20 and the p-type silicon film 6 are patterned by dry etching employing lithography. At this time, the polycrystalline silicon film 20 on a lower surface of the silicon nitride film 30 is formed as the n-type emitter layer 8 and sidewall conductive films 8a are formed on side surfaces of the SiGe layer 5 and the p-type silicon film 6. The dry etching is finished in a state where the p-type silicon film 6 remains also on the upper surface of the SiGe layer 5 without completely removing the p-type silicon film 6. Thus, the p-type silicon film 6 is so formed that the cross section thereof has a projecting portion.

Figure 8:
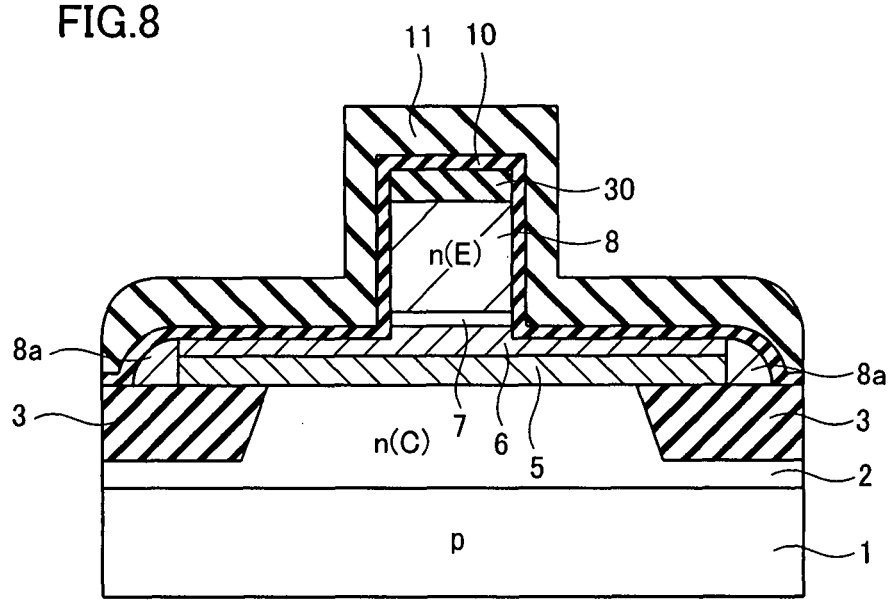

As shown in FIG. 8, a silicon nitride film 10 is so formed as to cover an overall surface. A silicon oxide film 11 is formed on an upper surface of the silicon nitride film 10.

Figure 9:
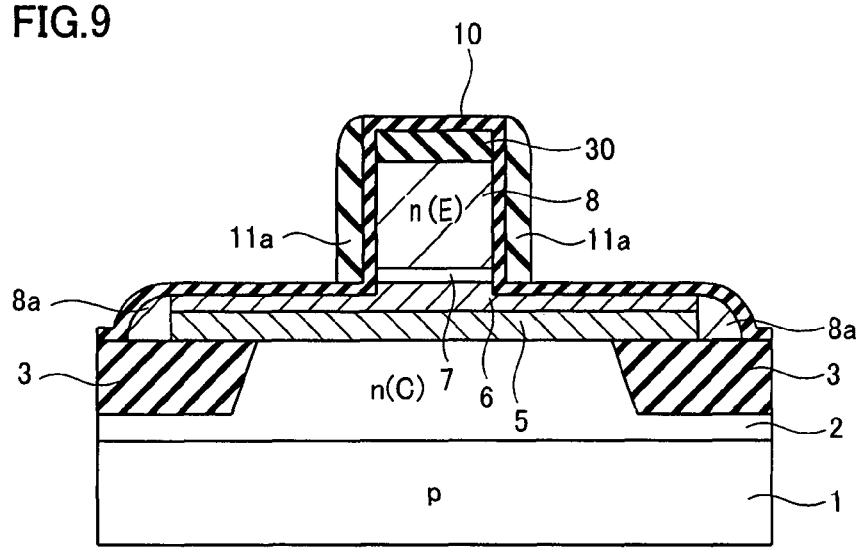

As shown in FIG. 9, an overall surface of the silicon oxide film 11 is etched back by dry etching, thereby forming the side wall insulating film 11a constituted by a silicon oxide film on the side surfaces of the projecting portion of the p-type silicon film 6, the charge transport prevention film 7, the n-type emitter layer 8 and the silicon nitride film 30 surrounded by the silicon nitride film 10

Figure 10:
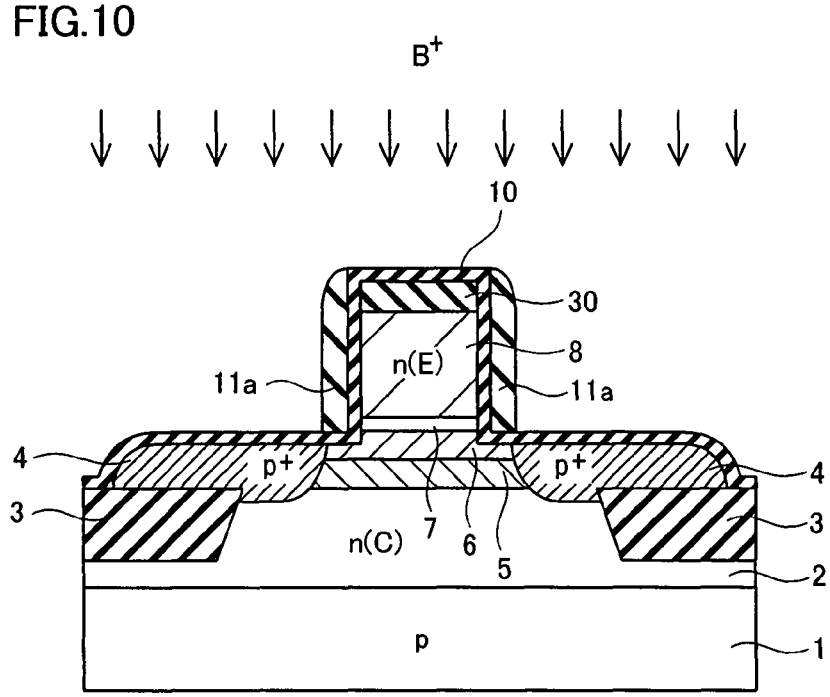

As shown in FIG. 10, boron (B) is implanted from the upper surfaces of the silicon nitride film 10 and the side wall insulating film 11a by ion implantation, thereby forming the pair of p$^+$ diffusion layers 4 so as to hold the SiGe layer 5 between portions implanted with boron of the p-type silicon film 6, the SiGe layer 5, the sidewall conductive film 8a and the n-type collector layer 2. At this time, boron ion (B+) does not pass through the silicon nitride film 30 on the n-type emitter layer 8, and hence boron ion (B+) is not implanted into the n-type emitter layer 8.

Figure 11:
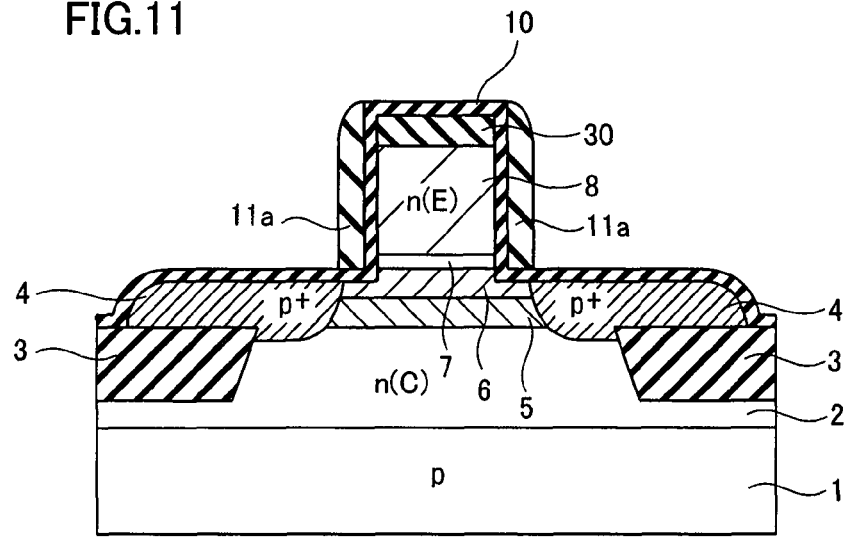

As shown in FIG. 11, thermal treatment is performed by RTA (rapid thermal anneal), thereby activating an n-type impurity of the n-type emitter layer 8.

Figure 12:
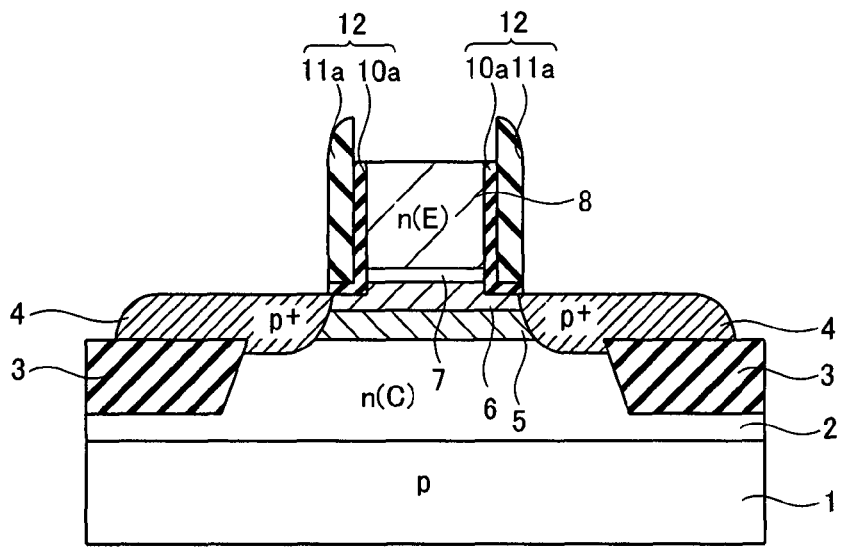

As shown in FIG. 12, the silicon nitride film 10 on the prescribed upper surfaces of the isolation region 3, the p$^+$ diffusion layers 4 and the silicon nitride film 30 shown in FIG. 11 is removed by employing phosphoric acid. Similarly, the silicon nitride film 30 and the silicon nitride film 10 on the collector electrode (not shown) are removed, thereby forming the side wall insulating film 12 constituted by the silicon nitride film 10a and the side wall insulating film 11a. Thus, the silicon nitride film 10a is formed only between the side wall insulating film 11a and the p-type silicon film 6, between the side wall insulating film 11a and the charge transport prevention film 7, and between the side wall insulating film 11a and the n-type emitter layer 8. Thus, the silicon nitride film 10a is located between the side wall insulating film 11a and the p-type silicon film 6, whereby boron (B) as the impurity contained in the p-type silicon film 6 can be prevented from diffusing into the side wall insulating film 11a when performing thermal treatment. Consequently, the prescribed impurity concentration of boron (B) can be maintained in the p-type silicon film 6, whereby the bipolar transistor 100 having characteristics as designed can be obtained.

As shown in FIG. 1, a cobalt (Co) layer (not shown) is formed on the upper surfaces of the n-type emitter layer 8 and the p$^+$ diffusion layers 4 and thereafter thermal treatment is performed, thereby forming the cobalt silicide films 9a and 9b. Thus, a parasitic resistance generated in base electrode (not shown) linked to an inner base layer (portions having the same width as that of the n-type emitter layer 8 and located under the n-type emitter layer 8 in the SiGe layer 5 and the p-type silicon film 6) and an extrinsic base layer (base layer other than the inner base layer) can be reduced.

Thereafter contact portions of the collector electrode, the base electrode, and the emitter electrode are opened after depositing an interlayer dielectric film such as plasma TEOS film on a surface of the bipolar transistor 100, although not shown. A barrier metal layer consisting of Ti or the like, and a conductive layer consisting of Al or Al alloy are formed, thereby forming the npn bipolar transistor 100 according to the first embodiment.

According to the first embodiment, as hereinabove described, the charge transport prevention film 7 having an effect as a potential barrier with respect to holes is provided between the SiGe layer 5 and the n-type emitter layer 8. Therefore, electrons can move from the n-type emitter layer 8 to the SiGe layer 5, while holes can be sufficiently inhibited from moving from the SiGe layer 5 to the n-type emitter layer 8. Thus, also when an excessive quantity of impurity is implanted into the SiGe layer 5, movement of the holes is sufficiently suppressed with the charge transport prevention film 7, and hence the resistance of the SiGe layer 5 can be reduced and reduction in the gain of the bipolar transistor 100 can be suppressed. Additionally, the reduction in the resistance of the SiGe layer 5 can reduce the thickness of the SiGe layer 5 while the SiGe layer 5 is at a low resistance. Thus, a base transit time can be reduced, and hence the high-frequency performance of the bipolar transistor 100 can be improved and a NF (noise figure) representing the noise characteristic of the bipolar transistor 100 can be also improved.

According to the first embodiment, as hereinabove described, the charge transport prevention film 7 is formed by the TiO$_2$ film employed as a semiconductor material having a larger band gap than Si. The TiO$_2$ film of the semiconductor material has the effect as the potential barrier with respect to holes while the TiO$_2$ film does not substantially act as the potential barrier with respect to electrons. The TiO$_2$ film suppresses diffusion of metal atoms, and hence the TiO$_2$ film inhibit metal atoms from diffusing into the p-type silicon film 6 under the n-type emitter layer 8. Due to this effect, a metal emitter can be easily fabricated by a silicide process in place of a conventional emitter layer prepared by forming the n-type emitter layer 8 by a polycrystalline silicon film. Additionally, the n-type emitter layer 8 may be provided under the TiO$_2$ film. This easily ensures the thickness of the n-type emitter layer 8, and control of an gain can be simplified. Thus, the resistance of the n-type emitter layer 8 can be reduced, and hence high-frequency performance can be increased.

According to the first embodiment, as hereinabove described, the charge transport prevention film 7 contains carbon as an impurity, whereby carbon contained as the impurity is diffused into the SiGe layer 5 when the npn bipolar transistor 100 is subjected to thermal treatment. Carbon is introduced into the SiGe layer 5, whereby the strain of the SiGe layer 5 is relaxed, and the Ge concentration of the SiGe layer 5 can be increased without forming crystal defects. In the SiGe layer 5 into which carbon is introduced, boron (B) can be inhibited from diffusing into the n-type collector layer 2 also when the concentration of boron (B) as the impurity contained in the SiGe layer 5 is increased.

According to the first embodiment, as hereinabove described, the TiO$_2$ film having the higher dielectric constant as compared with that of silicon is employed as the charge transport prevention film 7, whereby an electric field applied to the charge transport prevention film 7 is reduced, and hence the gradient of the potential barrier of the charge transport prevention film 7 is reduced. Thus, electrons can easily move over the potential barrier of the charge transport prevention film 7. Consequently, movement of electrons is accelerated and hence the high-frequency performance of the bipolar transistor 100 can be improved.

(Second Embodiment)

Figure 13:
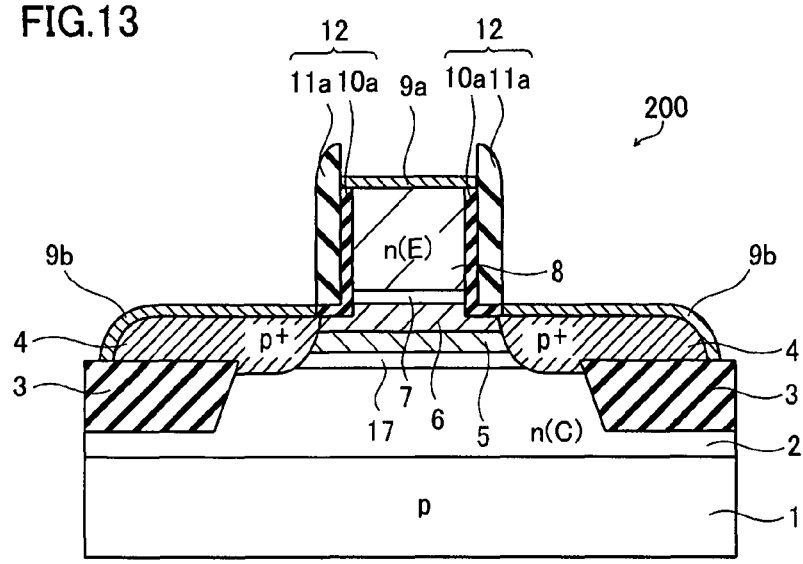
FIG. 13 is a cross sectional view showing a structure of a bipolar transistor according to a second embodiment of the present invention.

As shown in FIG. 13, in a bipolar transistor 200 according to a second embodiment of the present invention, a charge transport prevention film 17 is formed also between a SiGe layer 5 and an n-type collector layer 2 in addition to a charge transport prevention film 7 provided between a p-type silicon film 6 and an n-type emitter layer 8, dissimilarly to the bipolar transistor according to the aforementioned first embodiment. Thus, holes can be prevented from flowing into the n-type collector layer 2 from the SiGe layer 5 also in a state of flowing a large number of electrons into the n-type collector layer 2 as compared with a case the charge transport prevention film 17 does not exist, and hence an base expansion effect that an effective base width expands to a side of the n-type collector layer 2 can be suppressed. Consequently, a current value can be further increased. The charge transport prevention film 17 inhibits holes from moving from the n-type collector layer 2 to the SiGe layer 5, and hence an avalanche effect, a phenomenon that, when a high electric field in excess of a threshold value is applied to a semiconductor, accelerated electrons collide with other atoms and new electrons and holes are continuously generated like an avalanche, is suppressed. When a material having a lower dielectric constant than that of silicon is employed as the charge transport prevention film 17, an electric field applied to the charge transport prevention film 17 is increased and hence movement of electrons from the SiGe layer 5 to the n-type collector layer 2 is further accelerated. Thus, the high-frequency performance of the bipolar transistor 200 can be improved.

The remaining effects of the second embodiment are similar to those of the aforementioned first embodiment.

(Third Embodiment)

In a bipolar transistor 300 according to a third embodiment of the present invention, charge transport prevention portions 28 are partially formed in an n-type diffusion layer 27 (emitter layer) dissimilarly to the aforementioned first embodiment.

Figure 14:
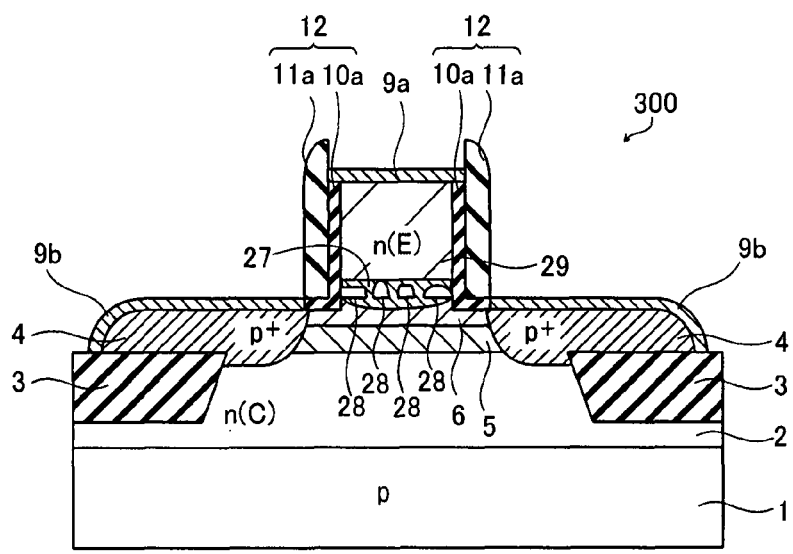
FIG. 14 is a cross sectional view showing a structure of a bipolar transistor according to a third embodiment of the present invention.

In the bipolar transistor 300, the n-type diffusion layer 27 is formed on an upper surface of a p-type silicon film 6 as shown in FIG. 14. The charge transport prevention portions 28 constituted by crystal grains are partially formed in the n-type diffusion layer 27 so as to be dotted. The charge transport prevention portions 28 are not in the form of a layer and so formed as to have intervals between the adjacent charge transport prevention portions 28. The charge transport prevention portions 28 consisting of $TiO_2$ each have a grain size of about 5 nm to about 20 nm. The charge transport prevention portions 28 hardly suppress movement of electrons, while having a function of sufficiently suppressing movement of holes. The dielectric constant of $TiO_2$ constituting the charge transport prevention portions 28 is about 50, which is a higher dielectric constant as compared with that of silicon (about 11.9). An n-type emitter layer 29 having a thickness of about 200 nm is formed on an upper surface of the n-type diffusion layer 27. The n-type diffusion layer 27 and the n-type emitter layer 29 are examples of the "emitter layer" in the present invention. Cobalt silicide films 9a and 9b are formed on upper surfaces of the n-type emitter layer 29 and a pair of $p^+$ diffusion layers 4 respectively. A silicon nitride film 10a is formed on a prescribed region of the p-type silicon film 6, side surfaces of the n-type diffusion layer 27, the charge transport prevention portions 28, the n-type emitter layer 29 and the cobalt silicide film 9a. A side wall insulating film 11a is formed on side surfaces of the silicon nitride film 10a. A side wall insulating film 12 is formed by these silicon nitride film 10a and side wall insulating film 11a.

A process of fabricating the bipolar transistor according to the third embodiment of the present invention will be described with reference to FIGS. 15 to 20.

Figure 15:
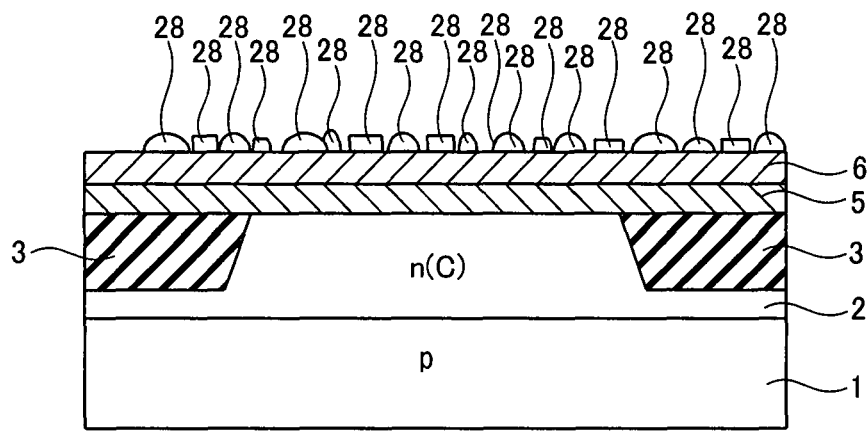
FIGS. 15 to 20 are cross sectional views for illustrating a process of fabricating the bipolar transistor according to the third embodiment shown in FIG. 14.

First, after the fabricating process of the first embodiment shown in FIG. 3, the SiGe layer 5 having a thickness of about 40 nm and the p-type silicon film 6 having a thickness of about 40 nm are successively formed on the upper surfaces of the n-type collector layer 2 and the isolation region 3 by low pressure CVD as shown in FIG. 15.

The charge transport prevention portions 28 consisting of $TiO_2$ is formed on the surface of the p-type silicon film 6 by low pressure CVD. The charge transport prevention portions 28 are so formed as to be crystal grains or amorphous grains each having a grain size of about 5 nm to about 20 nm by growing diseparate crystals of $TiO_2$ on the surface of the p-type silicon film 6 with a prescribed number density and growing crystals of $TiO_2$. The charge transport prevention portions 28 are so formed as to have the intervals between the adjacent charge transport prevention portions 28. The intervals between the adjacent charge transport prevention portions 28 act as paths for diffusing the n-type impurity of the n-type emitter layer 29 into a polycrystalline silicon film 40 and the p-type silicon film 6 when performing thermal treatment described later.

Figure 16:
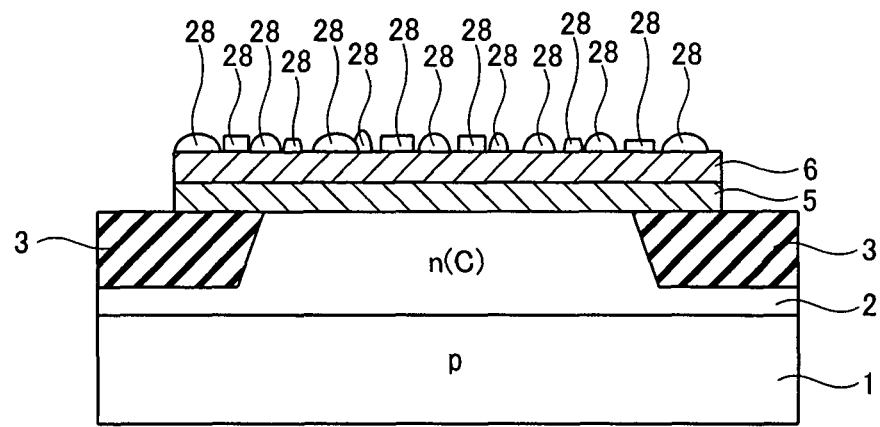

As shown in FIG. 16, prescribed regions of the SiGe layer 5, the p-type silicon film 6 and the charge transport prevention portions 28 are removed by dry etching employing lithography.

Figure 17:
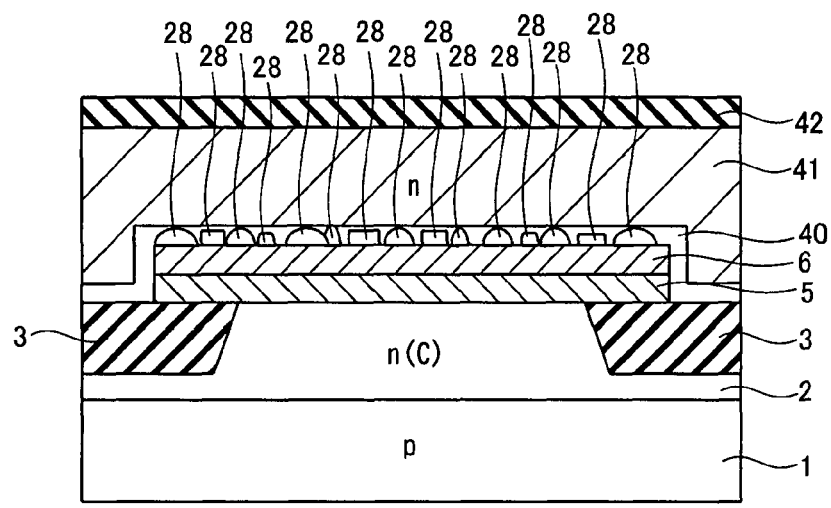

As shown in FIG. 17, the polycrystalline silicon film 40 not containing an impurity, having a thickness of about 10 nm, a polycrystalline silicon film 41 doped with an n-type impurity and a silicon nitride film 42 are successively formed on the upper surfaces of the isolation region 3, the p-type silicon film 6 and the charge transport prevention portions 28.

Figure 18:
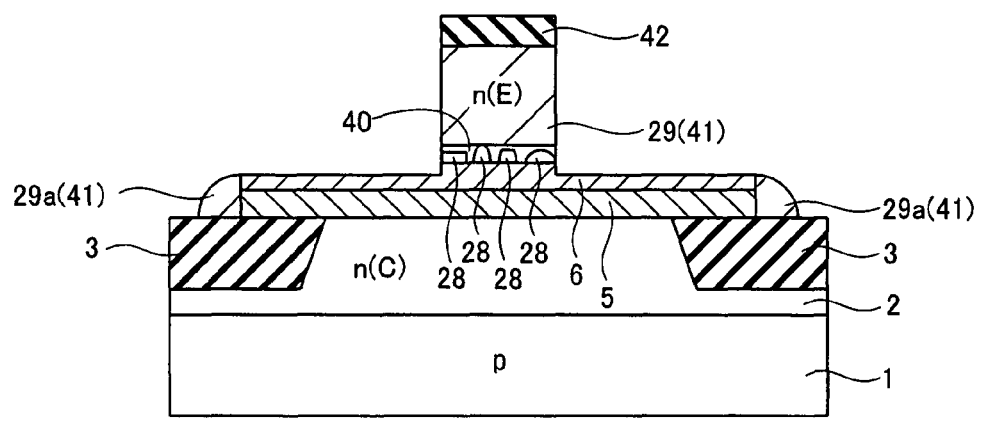

As shown in FIG. 18, the silicon nitride film 42, the polycrystalline silicon film 41, the charge transport prevention portions 28 and the polycrystalline silicon film 40 are patterned by dry etching employing lithography. At this time, the polycrystalline silicon film 41 is processed as the n-type emitter layer 29 and side wall conductive films 29a formed on side surfaces of the SiGe layer 5 and the p-type silicon film 6. The dry etching is finished in a state where the p-type silicon film 6 remains also on the upper surface of the SiGe layer 5 without completely removing the p-type silicon film 6. Thus, the p-type silicon film 6 is so formed that the cross section thereof has a projecting portion.

Figure 19:
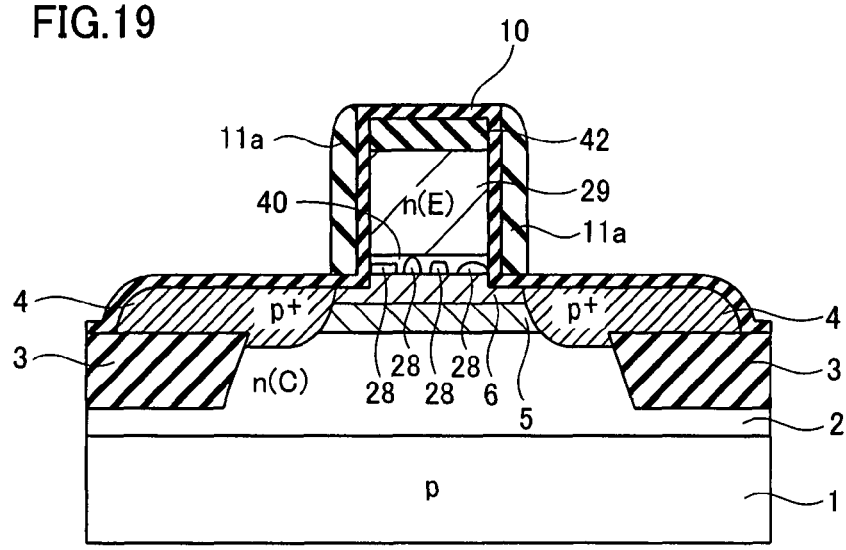

The bipolar transistor after fabricating processes similar to those of the first embodiment shown in FIGS. 8 to 10 is shown in FIG. 19.

Figure 20:
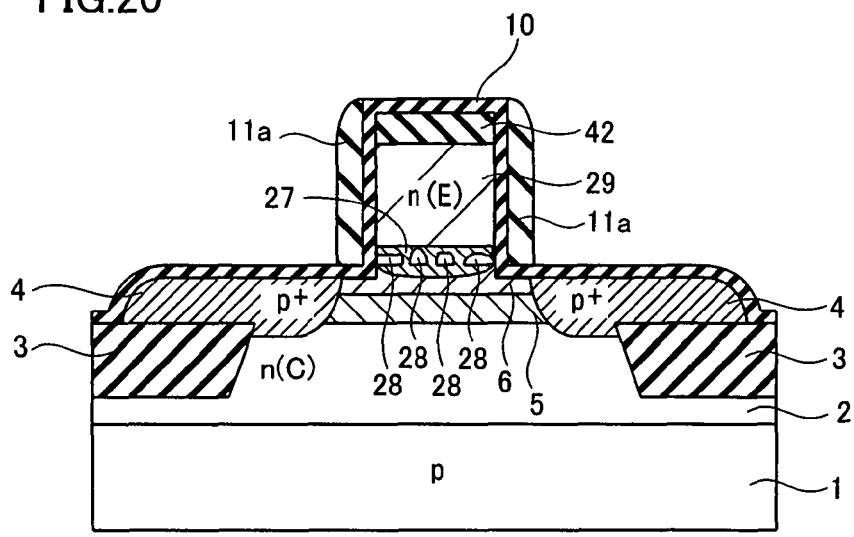

As shown in FIG. 20, the n-type impurity of the n-type emitter layer 29 is diffused in the polycrystalline silicon film 40 and the p-type silicon film 6 by performing thermal treatment at about 1050° C. for about 5 to about 30 seconds by RTA, thereby forming the n-type diffusion layer 27.

The bipolar transistor after fabricating processes similar to those of the first embodiment shown in FIGS. 12 and 13 is shown in FIG. 14. After forming a cobalt (Co) layer (not shown) on the upper surfaces of the n-type emitter layer 29 and the $p^+$ diffusion layers 4, the cobalt silicide films 9a and 9b are formed by performing thermal treatment.

Thereafter contact portions of the collector electrode, the base electrode, and the emitter electrode are opened after depositing an interlayer dielectric film such as a plasma TEOS film on a surface of the bipolar transistor 300, although not shown. A barrier metal layer consisting of Ti or the like, and a conductive layer consisting of Al or Al alloy are formed, thereby forming the bipolar transistor 300.

According to the third embodiment, as hereinabove described, the charge transport prevention portions 28 are partially formed in the n-type diffusion layer 27 (emitter layer), whereby portions where the amplification of current is caused due to the concentration difference between impurities contained in the p-type silicon film 6 (base layer) and the n-type diffusion layer 27 (emitter layer) and portions where movement of charges are suppressed by the charge transport prevention portions 28 are formed. A hole current responsive to the concentration difference between the impurities contained in the p-type silicon film 6 (base layer) and the n-type diffusion layer 27 (emitter layer) is generated in portions where the charge transport prevention portions 28 do not exist, while the hole current is inhibited by potential barriers of the charge transport prevention portions 28 in portions where the charge transport prevention portions 28 exist. Consequently, the flow of the overall hole current of the n-type diffusion layer 27 (emitter layer) is inhibited as compared with a case where the charge transport prevention portions 28 are not provided. Thus, the gain of the bipolar transistor 300 determined by the ratio between a hole current and an electron current can be increased as compared with the case where the charge transport prevention portions 28 are not provided. Additionally, the flow of the hole current can be controlled by changing the area of the portions where the charge transport prevention portions 28 exist, and hence the gain of the bipolar transistor can be controlled. It has been confirmed from a simulation made by the inventors described later that the gain of the bipolar transistor can be controlled by changing the area of the portions where the charge transport prevention portions 28 exist.

The remaining effects of the third embodiment are similar to those of the aforementioned first embodiment.

Figure 21:
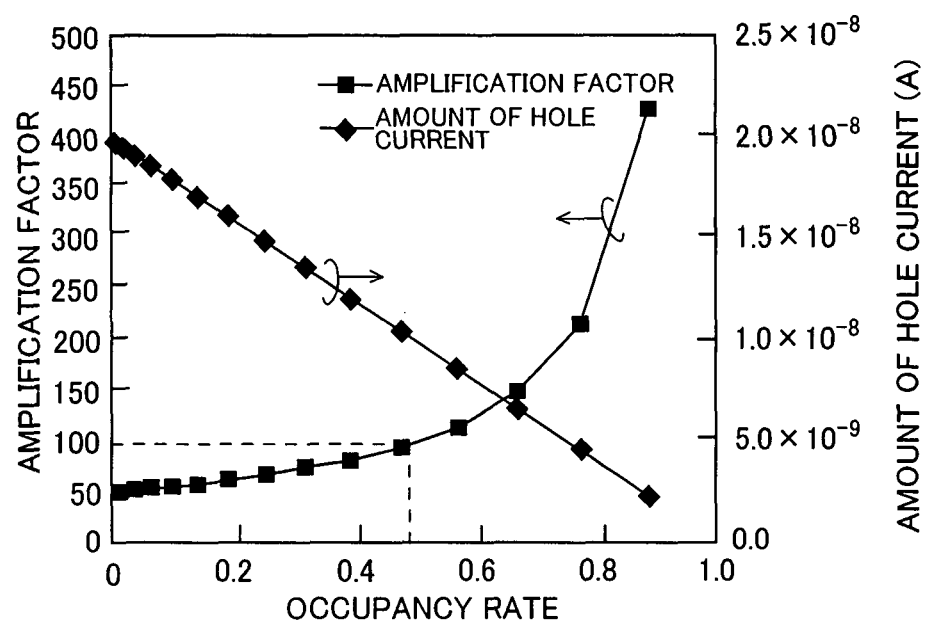
FIG. 21 is a diagram showing the relation of the amount of a hole current and the gain of the bipolar transistor with respect to the occupancy rate of charge transport prevention portions partially formed.

The results of the simulation performed for confirming effects of the aforementioned third embodiment shown in FIG. 21 will be now described. In this simulation, the amounts of a hole current and the gains of the bipolar transistor with respect to the occupancy rates in the forming surfaces of the charge transport prevention portions partially formed were calculated. In the simulation, the number density of the charge transport prevention portions was set to $5 \times 10^{11}$ per 1 cm$^2$, the crystal grain size of the charge transport prevention portions were changed to 1 nm to 15 nm.

The axis of abscissa represents an occupancy rate of the partially formed charge transport prevention portions, for example, on the base layer, while the axes of ordinate represent the amount of a hole current (right axis of ordinate) and the gain of the bipolar transistor (left axis of ordinate). In the simulation, a numeric value was calculated assuming that the gain of the bipolar transistor is 50 in a case where the charge transport prevention portions are not formed (case where an occupancy rate is 0). More specifically, it was assumed that the amount of a collector current is 1 µA, and the amount of a base current is 20 nA in a case where the charge transport prevention portions are not formed. As shown in FIG. 21, as the occupancy rate increases, the hole current linearly decreases. As the occupancy rate increases, the gain of the bipolar transistor increases. As the occupancy rate increases, the degree of the amplification increases. It is understood that the occupancy rate of the charge transport prevention portions on the base layer is better set to less than about 0.5 when the gain of the bipolar transistor is set to 100. Thus, it has been able to be confirmed from the results of the simulation that the gain of the bipolar transistor can be changed by changing the occupancy rate of the charge transport prevention portions.

(Fourth Embodiment)

Figure 22:
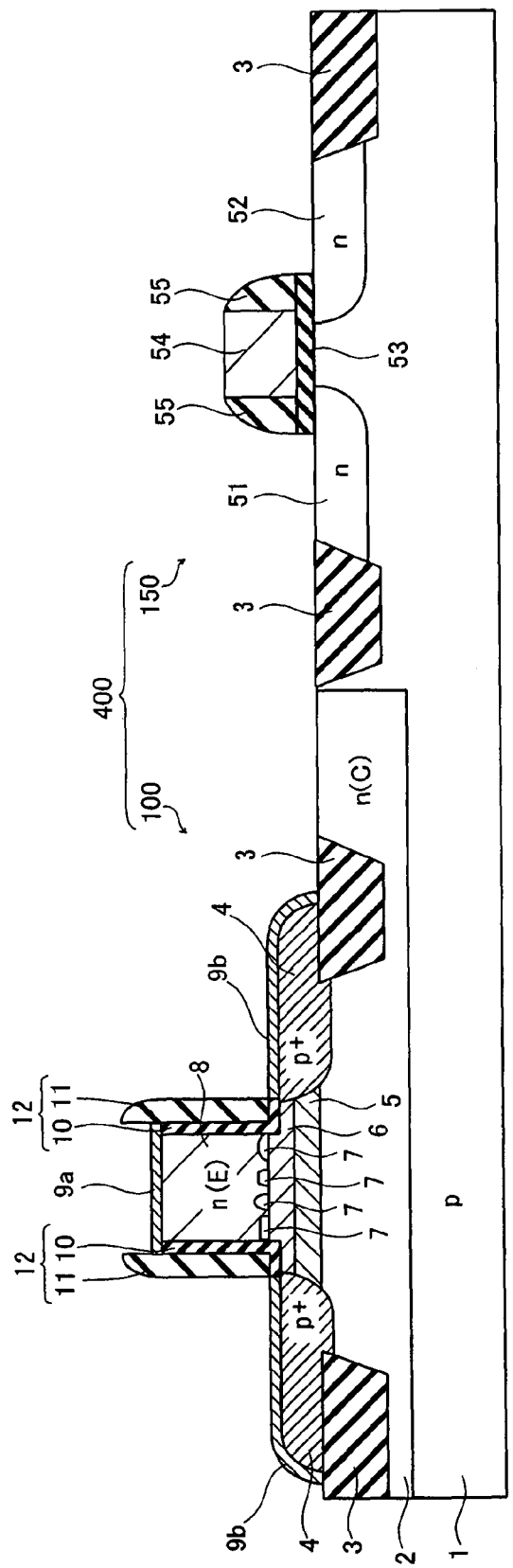
FIG. 22 is a cross sectional view showing a structure of a semiconductor device according to a fourth embodiment of the present invention.

In a semiconductor device 400 according to a fourth embodiment of the present invention, an n-type field-effect transistor 150 is so formed as to be adjacent to an npn bipolar transistor 100 according to the aforementioned first embodiment, as shown in FIG. 22. An charge transport prevention film 7 of the bipolar transistor 100 according to the fourth embodiment is formed by a polycrystalline film constituted by crystal grains each having a crystal grain size of about 5 nm to about 20 nm.

In the field-effect transistor 150, an isolation region 3 employing STI, for isolating the bipolar transistor 100 and the field-effect transistor 150 are formed on a surface of a silicon substrate 1. Impurity regions 51 and 52 serving as n-type source/drain of the field-effect transistor 150 are so formed on the surface of the p-type silicon substrate 1 at a prescribed interval as to hold a channel region therebetween.

A gate insulating film 53 consisting of SiO$_2$ is formed on a region on which the field-effect transistor 150 is formed on the surface of the p-type silicon substrate 1. A gate electrode 54 consisting of polysilicon is formed on a surface of the gate insulating film 53. Side wall insulating films 55 are formed on side surfaces of the gate electrode 54.

The remaining structure of the bipolar transistor 100 is similar to that of the first embodiment.

A process of fabricating the semiconductor device 400 according to the fourth embodiment of the present invention will be now described.

Figure 23:
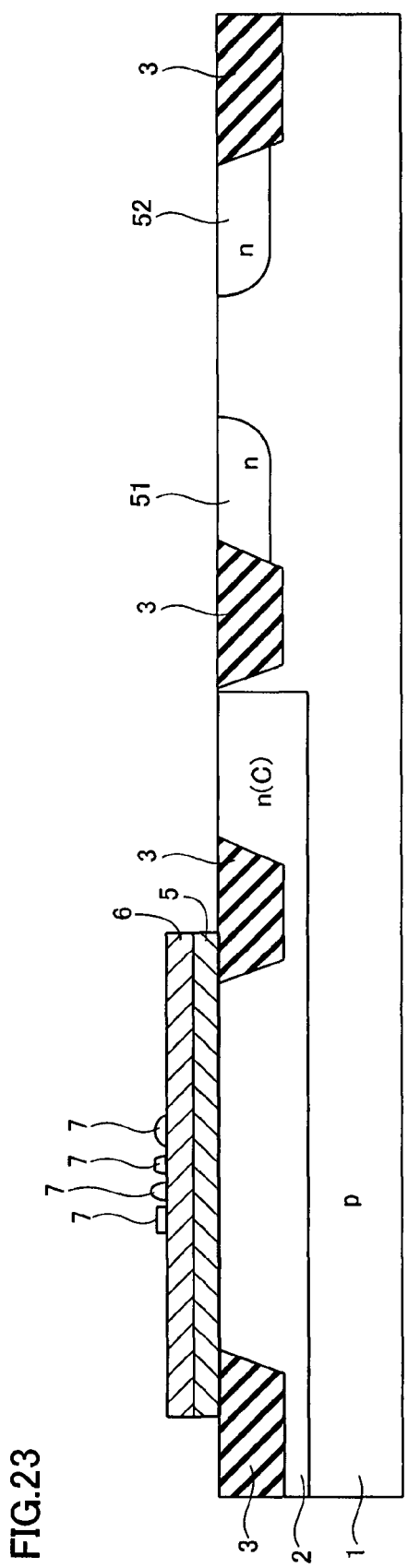
FIGS. 23 and 24 are cross sectional views for illustrating a process of fabricating the semiconductor device according to the fourth embodiment of the present invention shown in FIG. 22.

First, processes similar to those of the first embodiment shown in FIGS. 3 to 5 are carried out. At this time, the isolation region 3 employing STI is formed at a position to be adjacent to the bipolar transistor 100 on the silicon substrate 1 and the n-type impurity regions 51 and 52 are formed by ion-implanting an n-type impurity, as shown in FIG. 23. The polycrystalline film consisting of Ti is formed on a prescribed region on a surface of a p-type silicon film 6 by sputtering.

Figure 24:
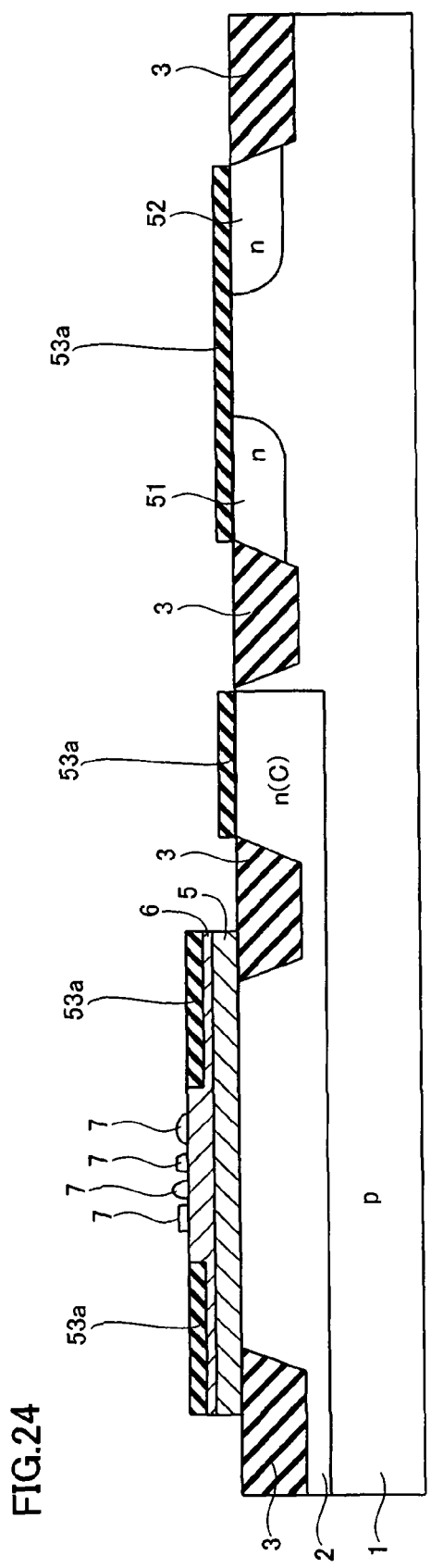

As shown in FIG. 24, a silicon oxide film 53a is formed on a surface of an element forming region by thermal oxidation. The polycrystalline film consisting of Ti, formed on the p-type silicon film 6 is oxidized with TiO$_2$ by this thermal oxidation, thereby forming the charge transport prevention film 7. The silicon oxide film 53a at a prescribed position is removed by lithography, thereby forming the gate insulating film 53. Thus, the oxidation step of Ti and the oxidation step for forming the gate insulating film 53 can be carried out through the same process. The gate insulating film 53 is formed by a material having a dielectric constant of less than 30. For example, the material includes a material containing Si, Hf, Zr, Ce, Pr, La, Al or the like.

The gate electrode 54 and the side wall insulating films 55 are successively formed on the surface of the gate insulating film 53, thereby forming a shape shown in FIG. 22.

According to the fourth embodiment, as hereinabove described, the gate insulating film 53 and the charge transport prevention film 7 constituted by different materials respectively are formed through the same oxidation step, whereby the number of steps can be inhibited from increase. The gate insulating film 53 formed through the same oxidation step as the charge transport prevention film 7 of TiO$_2$ having an effect as a potential barrier with respect to holes is formed by the material having a dielectric constant of less than 30, and hence has an effect as a potential barrier with respect to electrons. Thus, a leakage current generated between the gate electrode 54 and (the channel region of) the p-type silicon substrate 1 can be suppressed. Consequently, increase in power consumption can be suppressed.

(Fifth Embodiment)

According to a fifth embodiment, a bipolar transistor 250 is formed on an interlayer dielectric film 60 formed on a semiconductor device 400 according to the fourth embodiment shown in FIG. 22.

Figure 25:
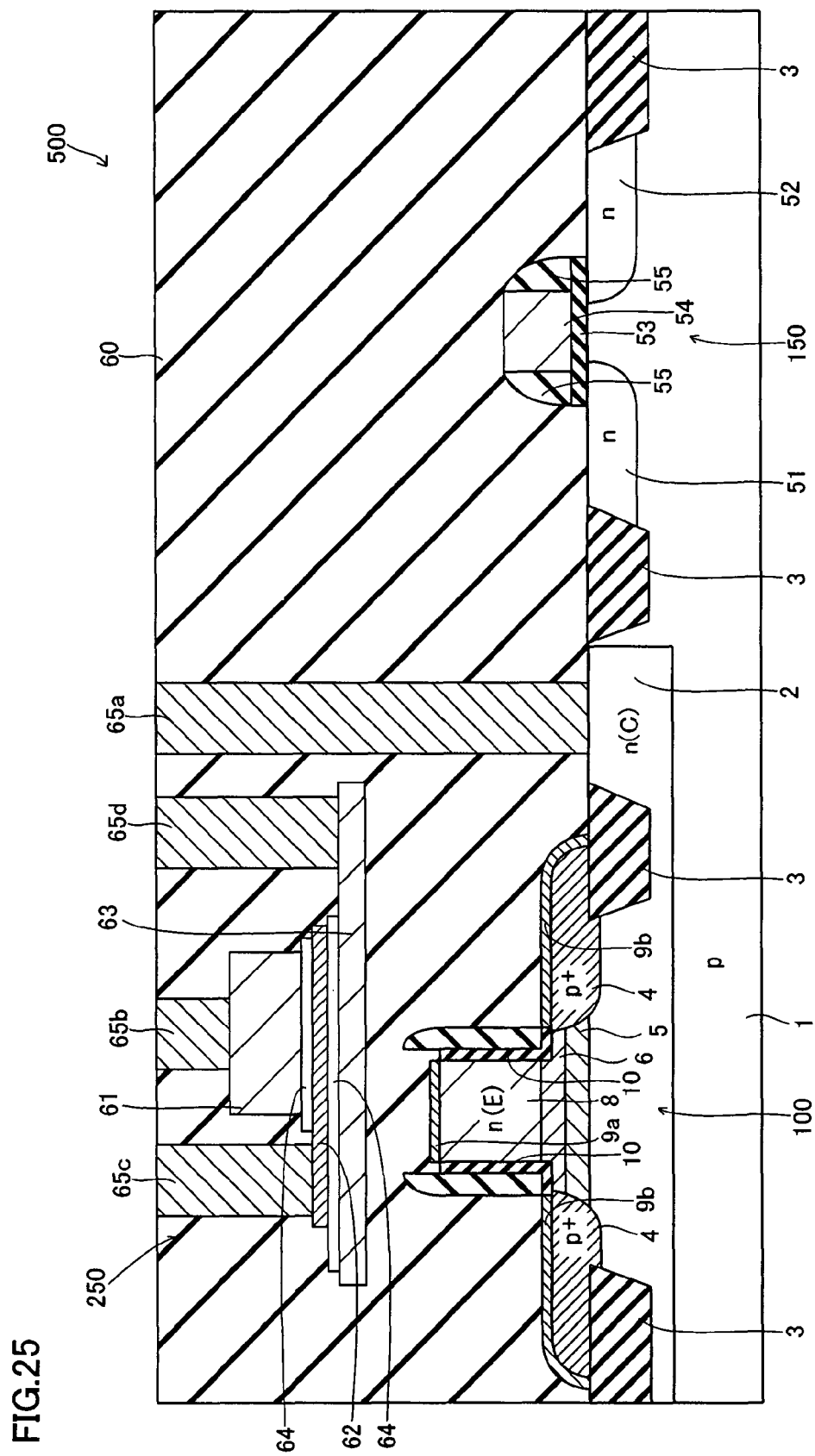
FIG. 25 is a cross sectional view showing a structure of a semiconductor device according to a fifth embodiment of the present invention.

In the bipolar transistor 250, an emitter layer 61, a base layer 62 and a collector layer 63 consisting of polysilicon are formed as shown in FIG. 25. Charge transport prevention films 64 consisting of TiO 2 are formed between the emitter layer 61 and the base layer 62 and between the base layer 62 and the collector layer 63 respectively.

Contact plugs 65a and 65b for transmitting an output signal are connected to an n-type collector layer 2 of a bipolar transistor 100 and the collector layer 63 of the bipolar transistor 250 respectively.

The remaining structures of the bipolar transistor 100 and a field-effect transistor 150 are similar to those of the fourth embodiment.

According to a fifth embodiment, as hereinabove described, the charge transport prevention films 64 each having a function as a potential barrier with respect to holes are formed between the emitter layer 61 and the base layer 62 and between the base layer 62 and the collector layer 63 respectively, whereby leakage currents generated between the emitter layer 61 and the base layer 62 and between the base layer 62 and the collector layer 63 can be suppressed. Thus, a polycrystalline material such as polysilicon can be employed as a material for forming the base layer 62 and hence the base layer 62 can be formed on the interlayer dielectric film 60. Therefore, the bipolar transistor 250 can be formed on the interlayer dielectric film 60.

Although the present invention has been described and illustrated in detail, it is clearly understood that the same is by way of illustration and example only and is not to be taken by way of limitation, the spirit and scope of the present invention being limited only by the terms of the appended claims.

For example, while the gate insulating film is formed by the material ($SiO_2$) different from the material ($TiO_2$) of the charge transport prevention film in the aforementioned first embodiment, the present invention is not restricted to this but the gate insulating film may be formed by a multilayer structure of a $TiO_2$ layer and a insulating film. In this case, the $TiO_2$ layer hardly has a function as a potential barrier with respect to electrons, and therefore an insulating film must be formed between the surface of the silicon substrate and the gate electrode. In a case of this structure, processes of forming the charge transport prevention film and the $TiO_2$ layer in the gate insulating film can be carried out through the same step.

While the charge transport prevention portion constituted by the $TiO_2$ film is employed in each of the aforementioned first to fifth embodiments, the present invention is not restricted to this but a charge transport prevention portion consisting of $SrTiO_3$ or $BaTiO_3$ may be employed. While the charge transport prevention portion may be formed by low pressure CVD as shown in each of the aforementioned first and third embodiments, but the charge transport prevention portion may be formed by an alternative method such as sputtering or evaporation, in place of low pressure CVD.

While the charge transport prevention portion is formed in the npn bipolar transistor in each of the aforementioned first to fifth embodiments, the present invention is not restricted to this but the charge transport prevention portion may alternatively be formed in a pnp bipolar transistor. At this time, a charge transport prevention portion substantially having no effect or having small effect as a potential barrier with respect to holes while having large effect as a potential barrier with respect to electrons must be employed.

While the collector layer is formed after forming the isolation region on the upper surface of the p-type silicon substrate in each of the aforementioned first to fifth embodiments, the present invention is not restricted to this but the isolation region may alternatively be formed after forming an epitaxial layer of silicon prepared by implanting an n-type impurity as the collector layer on the upper surface of the p-type silicon substrate.

While the base layer consisting of SiGe is formed on the upper surface of the n-type collector layer in each of the aforementioned first to fifth embodiments, the present invention is not restricted to this but a silicon film containing no boron (B) or a film of SiGe containing no boron (B) may alternatively be epitaxial grown by low pressure CVD before forming the base layer consisting of SiGe.

While the charge transport prevention films are formed between the emitter layer and the base layer, and between the emitter layer and the base layer and between the base layer and the collector layer in the aforementioned first and second embodiments respectively, the present invention is not restricted to this but the charge transport prevention film may alternatively be formed only between the base layer and the collector layer.

While the charge transport prevention film is formed between the emitter layer and the base layer, and between the base layer and the collector layer in the aforementioned second embodiment, the present invention is not restricted to this but the base layer may alternatively be formed by polycrystalline or amorphous material so far as the charge transport prevention film is formed between the emitter layer and the base layer. In this case, so far as the charge (hole) movement prevention film is formed between the emitter layer and the base layer, the doping concentration (carrier concentration) of the base layer can be increased while holding the extremely high gain. Therefore, a portion to which an electric field is applied hardly exists in the base layer, and disappearance or generation of carriers due to defects is unlikely to occur. Also on the interface between the charge transport prevention film and polysilicon, grain boundaries or dangling bonds of silicon are likely to be terminated by oxygen in the interfaces with adjacent oxides, and hence leakage currents are unlikely to be generated. As described above, also in a case where junction between the emitter layer and the base layer is replaced by junction between $n^+$ polysilicon and $p^+$ polysilicon, the low resistance of the base layer and high gain can be achieved while sufficiently suppressing a leakage current from the vicinity of pn junction due to existence of $TiO_2$ interposed therebetween.

Figure 26:
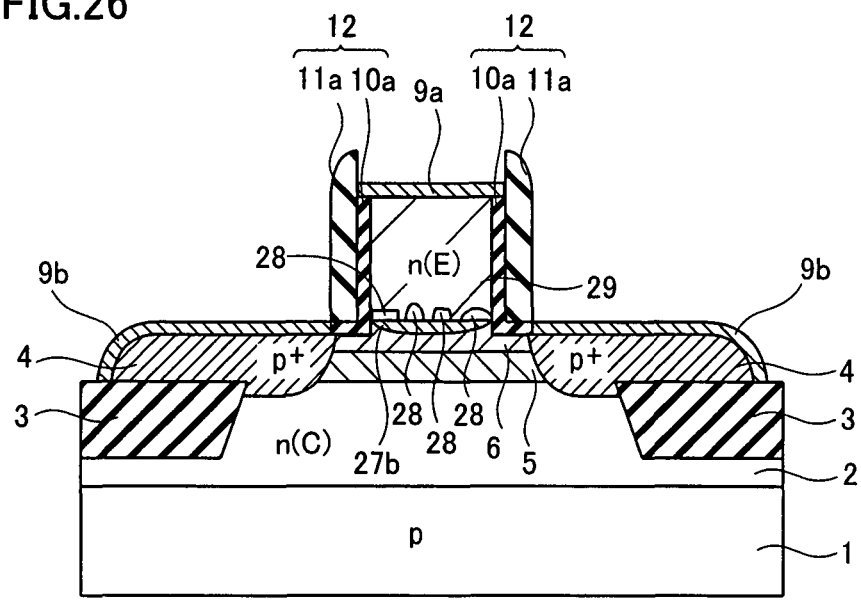
FIG. 26 is a cross sectional view of a bipolar transistor according to a modification of the third embodiment of the present invention.
Figure 27:
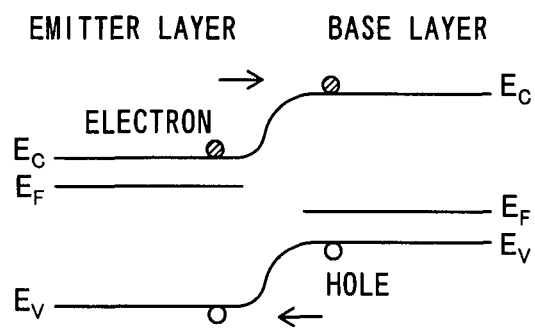
FIG. 27 is a diagram showing an energy band between an emitter layer and a base layer of a conventional bipolar transistor.

While the n-type diffusion layer 27 is formed by diffusing the n-type impurity of the n-type emitter layer 29 in the polycrystalline silicon film 40 and the p-type silicon film 6 by performing thermal treatment at about 1050° C. for about 5 to about 30 seconds by RTA in the aforementioned third embodiment, the present invention is not restricted to this but the an n-type diffusion layer 27b may alternatively be formed by diffusing the n-type impurity of the n-type emitter layer 29 in the p-type silicon film 6 without forming the polycrystalline silicon film 40, as shown in a modification of the third embodiment shown in FIG. 26.

What is claimed is:

1. A semiconductor device comprising:
  a collector layer having a first conductive type;
  a base layer having a second conductive type;
  a emitter layer having said first conductive type; and
  a charge transport prevention portion formed at least one of on a boundary between said collector layer and said base layer, in said base layer, on a boundary between said base layer and said emitter layer and in said emitter layer, having an effect as a potential barrier with respect to holes, and electrons move over the potential barrier of the charge transport prevention portion, wherein
  the charge transport prevention portion has an energy band in which a barrier height with respect to electrons is substantially zero to facilitate diffusion transport of electrons from said emitter layer to said base layer and a barrier height with respect to holes is larger than an energy of the holes to facilitate a barrier to hole transport from said base layer to said emitter layer.

2. The semiconductor device according to claim 1, wherein said charge transport prevention portion includes a charge transport prevention film formed in the form of a layer on the boundary between said base layer and said emitter layer, and wherein said base layer comprises a semiconductor material having a band gap smaller than that of said emitter layer.

3. The semiconductor device according to claim 1, wherein said charge transport prevention portions are formed on the boundary between said collector layer and said base layer and on the boundary between said base layer and said emitter layer respectively.

4. The semiconductor device according to claim 1, wherein said charge transport prevention portion is partially formed at least one of in said base layer, on the boundary between said base layer and said emitter layer, and in the said emitter layer.

5. The semiconductor device according to claim 4, wherein said charge transport prevention portion is constituted by partially forming aggregations of small pieces including crystals and having minute areas.

6. The semiconductor device according to claim 1, further comprising:
a side wall insulating film so formed as to cover side surfaces of said emitter layer and an upper surface of said base layer and a diffusion inhibition film for inhibiting an impurity from diffusing from said base layer into said side wall insulating film, formed at least between said base layer and said side wall insulating film.

7. The semiconductor device according to claim 2, wherein said charge transport prevention portion is constituted by a material having a dielectric constant of at least 30.

8. The semiconductor device according to claim 1, wherein said collector layer comprises silicon;
said base layer comprises silicon-germanium;
said emitter layer comprises silicon, and
said charge transport prevention portion includes a material having a larger band gap than silicon.

9. The semiconductor device according to claim 8, wherein said charge transport prevention portion comprises $TiO_2$ and has a thickness greater than 30 Angstroms to about 100 Angstroms.

10. The semiconductor device according to claim 9, wherein said charge transport prevention portion contains carbon as an impurity.

11. The semiconductor device according to claim 1, further comprising:
a semiconductor substrate formed with a bipolar transistor including said collector layer, said base layer, said emitter layer and said charge transport prevention portion; and
a field-effect transistor including a gate electrode formed on said semiconductor substrate through a gate insulating film, wherein
said gate insulating film is formed by a material different from that of said charge transport prevention portion.

12. The semiconductor device according to claim 11, wherein said gate insulating film is constituted by a material having a dielectric constant of less than 30.

13. The semiconductor device according to claim 1, further comprising:
a semiconductor substrate; and
an interlayer dielectric film formed on said semiconductor substrate, wherein a bipolar transistor including said collector layer, said base layer, said emitter layer and said charge transport prevention portion is formed on said interlayer dielectric film.

14. The semiconductor device according to claim 13, wherein said charge transport prevention portions of said bipolar transistor formed on said interlayer dielectric film are formed on the boundary between said collector layer and said base layer and on the boundary between said base layer and said emitter layer respectively.

15. The semiconductor device according to claim 13, further comprising a
transistor formed on a surface of said semiconductor substrate, wherein said interlayer dielectric film is so formed as to cover said transistor, and
said bipolar transistor is so formed as to be located above said transistor formed on said semiconductor substrate through said interlayer dielectric film.

16. The semiconductor device according to claim 1, wherein said base layer is formed by either a polycrystalline film or an amorphous film.

17. A semiconductor device comprising:
a first semiconductor layer of a first conductivity type configured as a collector layer;
a second semiconductor layer of a second conductivity type opposite to the first conductivity type configured as a base layer;
a third semiconductor layer of the first conductivity type configured as an emitter layer; and
a charge transport prevention portion comprising a material having a dielectric constant greater than about 30 in spaced relationship to a boundary between said base layer and said emitter layer, wherein
the charge transport prevention portion has an energy band in which a barrier height with respect to emitter layer majority carriers is substantially zero, the charge transport prevention portion is configured as a potential barrier to base layer majority carrier transport from the base layer to the emitter layer, and the charge transport prevention portion is configured to facilitate diffusion transport of emitter layer majority carriers from the emitter layer to the base layer.

18. The semiconductor device of claim 17, wherein:
the collector layer comprises a Group IV semiconductor material;
the base layer comprises a IV-IV heterostructure; and
the charge transport prevention portion comprises titanium dioxide and has a thickness greater than 30 Angstroms to about 100 Angstroms.

19. A semiconductor device comprising:
a first semiconductor layer of a first conductivity type configured as a collector layer;
a second semiconductor layer of a second conductivity type opposite to the first conductivity type configured as a base layer;
a third semiconductor layer of the first conductivity type configured as an emitter layer, the base layer comprising a semiconductor material having a smaller band gap than that of the emitter layer; and
a charge transport prevention portion comprising a high K dielectric material having a dielectric constant greater than about 30 and a thickness greater than 30 Angstroms, the charge transport prevention region in spaced relationship to a boundary between said base layer and said emitter layer.

20. The semiconductor device of claim 19, wherein:
the base layer comprises SiGe;
the emitter layer comprises polysilicon; and
the charge transport prevention portion comprises $TiO_2$.

* * * * *